March 17, 1953 M. SPARKS ET AL 2,631,356

METHOD OF MAKING P-N JUNCTIONS IN SEMICONDUCTOR MATERIALS

Filed June 15, 1950 3 Sheets-Sheet 1

INVENTORS M. SPARKS
G. K. TEAL
BY
D. MacKenzie
AGENT

March 17, 1953 M. SPARKS ET AL 2,631,356

METHOD OF MAKING P-N JUNCTIONS IN SEMICONDUCTOR MATERIALS

Filed June 15, 1950 3 Sheets-Sheet 2

INVENTORS M. SPARKS
G. K. TEAL
BY [signature]
AGENT

INVENTORS M. SPARKS
G. K. TEAL
BY
D. MacKenzie
AGENT

Patented Mar. 17, 1953 2,631,356

UNITED STATES PATENT OFFICE 2,631,356

METHOD OF MAKING P-N JUNCTIONS IN SEMICONDUCTOR MATERIALS

Morgan Sparks and Gordon K. Teal, Summit, N. J., assignors to Bell Telephone Laboratories, Incorporated, New York, N. Y., a corporation of New York Application June 15, 1950, Serial No. 168,181

6 Claims. (Cl. 29—25.3)

This invention relates to semiconductor translating devices and methods of making such. In particular, the invention relates to an improved method of making semiconductor bodies especially suitable for use in photoelectric cells, rectifiers and amplifiers which comprise a body of semiconductive material having contiguous portions of opposite electrical conductivity type. The semiconductive material may be germanium or silicon, and the present disclosure will be particularly concerned with the method of producing such contiguous portions, defining what are known as p-n junctions, in single rod crystals of germanium; the method is equally applicable when the material is silicon.

Point contact rectifiers of germanium are disclosed in the application of J. H. Scaff and H. C. Theuerer, filed December 29, 1945, Serial No. 638,351. Such rectifiers of silicon are disclosed in Patent 2,402,661, June 25, 1946, to R. S. Ohl. Photoelectric cells using silicon are disclosed in Patent 2,402,662, June 25, 1946, to R. S. Ohl, while amplifying p-n junctions in germanium and silicon are disclosed in the application of W. Shockley, filed June 26, 1948, Serial No. 35,423, now Patent 2,569,347, granted September 25, 1951.

A method of producing p-n junctions is disclosed in the application of M. Sparks, filed July 7, 1949, Serial No. 103,474. According to that method, a globule of molten p-type material is cast on a block of n-type material with which the globule on solidifying makes intimate contact, the surface of contact defining a p-n junction. The product is suitable as a rectifier, a photocell or for use in an amplifier.

The present invention makes use of the apparatus used in drawing single germanium crystals in rod form, disclosed and claimed by J. B. Little and G. K. Teal in their application Serial No. 138,354, filed January 13, 1950. In the use of this apparatus for producing p-n junctions in semiconductive material, a seed crystal of the material of one conductivity type is immersed to a small depth in a melt of the material of the opposite type and is withdrawn therefrom at a rate permitting the molten material adherent to the seed to crystallize as rapidly as it is withdrawn from the melt. By this procedure a transverse p-n junction is formed as part of a single crystal at the interface where the seed crystal joined the melt.

A general object of the invention is to provide an improved method of making p-n junctions in semiconductive material.

A specific object is to provide a method of making transverse p-n junctions in a single rod crystal of a semiconductor.

Another object is to produce a semiconductor rod crystal having transverse boundaries separating regions of different electrical conductivities.

A feature of the invention is the availability of the drawn crystal, containing a p-n junction, for use itself as a seed which may be partly immersed in another melt of semiconductive material of the same conductivity type as the original seed and used to draw from the second melt a combination of the rod crystal having a second p-n junction in which the order of the conductivity types is the reverse of that of the first junction, and so on.

The invention will be fully understood from the following description of an illustrative embodiment using germanium, read with reference to the accompanying drawing in which.

In all figures, like numerals designate like elements.

It is desirable to start with high-back voltage n-type germanium, prepared for example as described in the application of J. H. Scaff and H. C. Theuerer, "Preparation of Germanium Rectifier Material," filed October 27, 1948, Serial No. 56,742, now Patent 2,576,267. This n-type material may be converted to p-type by adding as an impurity a minute amount, say one part in a million, of an element of the third column of the periodic table; gallium is a suitable acceptor element for this purpose.

An n-type germanium seed may be obtained by drawing from a melt of n-type germanium a rod crystal as disclosed by Little and Teal in their above-mentioned application, and subdividing and machining the rod into desired lengths of desired crystalline orientations. Equally a p-type seed may be similarly obtained from the converted n-type material. The use of such seeds in drawing p-n junctions will now be described.

Figures 1, 2A, 2B:
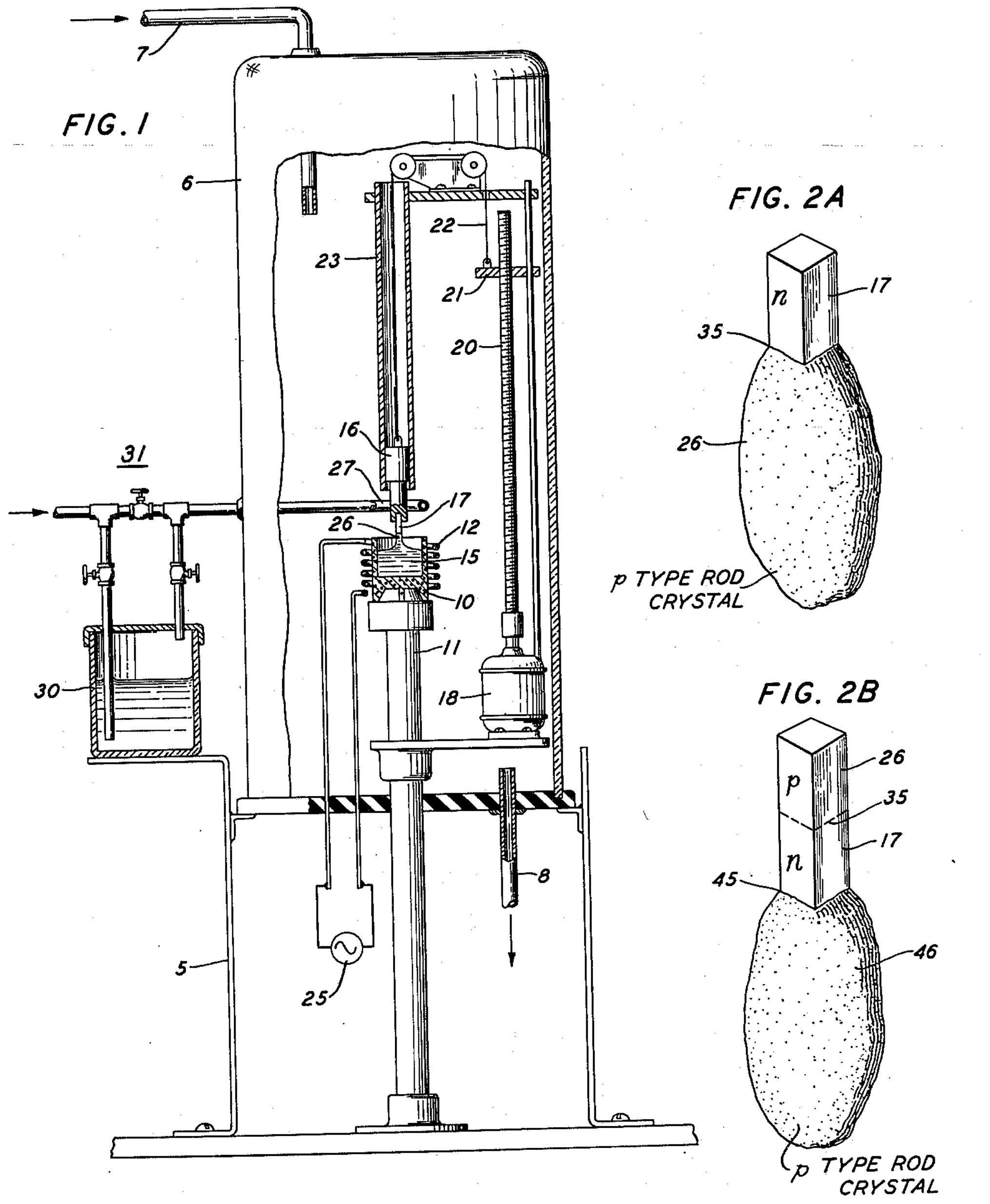
Fig. 1 is a vertical diametral section showing the principal features of the apparatus for drawing single crystals of germanium in rod form.
Figs. 2A and 2B show the appearance of actual germanium crystals containing p-n junctions, drawn with the apparatus of Fig. 1.

Referring to Fig. 1, stand 5 supports bell jar 6 through which hydrogen or any desired gas may be passed, entering at inlet 7 and emerging at outlet 8. In bell jar 6 may be viewed the apparatus for melting the germanium and drawing from the melt a rod-shaped single crystal. This apparatus comprises graphite crucible 10 supported by post 11 and surrounded by water-cooled coils 12 traversed by a high frequency current which heats by induction crucible 10 and its contents 15, consisting of buttons or ingots of germanium, of high purity n-type if a p-type seed is to be used or of germanium made p-type by admixture of an acceptor impurity, as earlier described, for use with an n-type seed.

Above crucible 10, weight 16, to which is fastened a seed crystal 17 of germanium, travels vertically and moves upward when motor 18 is started to turn threaded shaft 20, drawing downward traveling nut 21 and with it wire 22, which passes over pulleys as shown and is attached to weight 16. Tube 23 guides the travel of weight 16.

Germanium mass 15, in solid form, is placed in crucible 10, jar 6 is lowered into place and flushed with nitrogen to replace air. Hydrogen then is passed through the apparatus at the rate of about 100 cubic feet per hour. High frequency current source 25 is then applied to coils 12 and mass 15 is melted. It is important to use a current source of frequency high enough (350,000 cycles per second is suitable) to avoid violent agitation of the molten germanium by induced currents reaching through the crucible into the melt. Mass 15, now molten, is heated to and left at a temperature several degrees above its melting point long enough for the establishment of thermal equilibrium throughout crucible and melt. By appropriate operation of motor 18, a seed crystal 17 of the desired conductivity type and suitable size and crystal orientation is lowered into the melt to be immersed therein to a depth of a millimeter or so. Some of the immersed portion is melted to relieve strains in the seed; it will be understood that the melt is strongly enough of the chosen conductivity type to remain of that type despite its minute dilution by the melted portion of a seed of the opposite conductivity type.

Motor 18 is then operated to raise seed 17 at the rate of approximately 0.19 inch per minute. This rate has been found to be substantially that at which the germanium crystallizes in column 26 of the melt initially uplifted by surface tension about the lower end of the seed and adhering thereto as the seed is raised.

As column 26 is lifted, jets of hydrogen are played on it through orifices in ring 27 to cool the region of the liquid-solid interface. The hydrogen of these jets flows at about 3 cubic feet per hour, and may be taken from a supply tank directly or through water in jar 30, as valves 31 are manipulated.

The diameter of the rod of germanium so drawn is controllable by varying the flow of hydrogen in the cooling jets or by varying the temperature of the melt; the diameter of the rod is smaller the higher the melt temperature or the less the rate of flow of cooling hydrogen. Rods drawn as described are found to be single crystals of germanium with the same crystal orientation as that of the seed crystal.

With the apparatus described, a rod crystal, of p-type or of n-type conductivity, may be drawn from a melt of germanium of the same conductivity type, and from such a rod may be selected and machined portions to serve as seed crystals for drawing p-n junctions. A p-type seed crystal may be applied to an n-type melt, or inversely.

Fig. 2A shows a crystal drawn by a high purity n-type seed from a doped p-type melt. In the initial melting of a minute portion of the seed, some n-type material is added to the p-type melt but no change in conductivity type of the melt results because of the relative high purity of the seed as compared to the melt. If doped n-type seed is applied to a high purity p-type melt, the contamination of the melt by the n-type material received from the seed alters the electrical properties of the melt and the resulting boundary between the seed and the remainder of the rod is more diffuse than when the seed is pure n-type. The more diffuse boundary so produced is none the less useful. It is to be understood that whenever herein an n-type seed and a p-type melt are stated to be used, the inverse is equally possible. The word doped refers to semiconductor material to which impurities of the stated type have been purposely added.

In Fig. 2A, seed 17 is joined at the line 35 to the portion 26 drawn from melt 15. Line 35 is the locus of a transverse p-n junction, the portions 17 and 26 being respectively n-type and p-type.

In Fig. 2B, the p-n junction 17—26 is understood to have been mounted and suitably machined to serve as a seed for drawing a p-n-p junction. The portion 17 is again partly immersed in a p-type germanium melt and slowly withdrawn as before. Now there is formed a single rod crystal of germanium of which the end regions 26 and 46 are p-type with an intermediate n-type region 17 joined to the p-type regions by p-n junctions 35 and 45.

In each of the rods of Figs. 2A and 2B, the seed is machined before it is immersed in the melt and the crystal thereby drawn is of the shape indicated. Subsequent machining and cutting provides a crystal element of the shape shown in Fig. 3 included in a circuit for measuring the electrical characteristics of the junction.

It has been mentioned that the p-type melt is obtained by adding a minute impurity of a third column element to a high-back voltage n-type germanium melt. Where a p-type melt is to be converted to n-type, an impurity from the fifth column is added, suitably antimony.

In drawing a p-n junction with an n-type seed, the seed necessarily is heated by the molten germanium and is in consequence partly or wholly converted to p-type. This effect can be reversed by 24 hours' heat treatment at 500° C. in helium.

Figure 3:
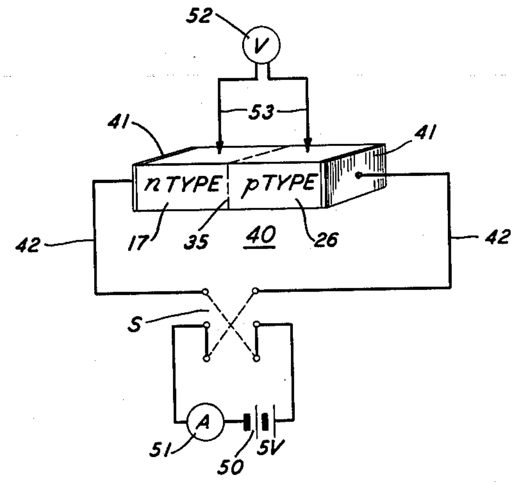
Fig. 3 is a schematic diagram of an electrical circuit for measuring the electrical properties of p-n junctions.

After such heat treatment, the rods containing p-n junctions are machined as desired, for example to the shape of block 40 in Fig. 3. Here the rod has been cut to rectangular faces in each direction and ohmic connections 41, 41 for leads 42, 42 are made to the outer transverse faces parallel to the p-n boundary, indicated in Fig. 3 by the dotted line 35.

Before the germanium unit 40 including junction 35 with its soldered leads 42, 42, is used as a circuit element it is advantageously etched and cleaned. A suitable, though not necessarily the only satisfactory, procedure involves the following steps:

1. Etch the unit in a vigorous etchant, about one minute or until germanium to a depth of several thousandths of an inch has been removed from the surface, masking the leads 42 and the ohmic connections 41. Polystyrene cement and ceresin wax are suitable for masks.

2. Wash with distilled water, blot, and measure the current in the reverse (n to p) direction at a convenient test voltage, say 5 volts.

3. Re-etch as in step 1 and repeat step 2. If the test current has changed from that first measured by more than 25 per cent, repeat all three steps until the reverse current changes less than 25 per cent.

4. Etch the unit electrolytically for one minute in a 10 per cent solution of sodium hydroxide, making the unit 3 volts anode to a platinum or graphite cathode.

5. Wash with distilled water and dry.

6. Dip the unit in a molten wax of low electrical conductivity, such as ceresin. This stabilizes the junction and a test current as in step 2 is usually not more than one-tenth that first observed in step 2.

Whatever the procedure of preparing the p-n germanium junction for use, the objects are to etch the surface to remove surface cracks and strains (germanium is especially sensitive to strains), to rid the surface of adsorbed mobile ions and to cover the surface with a non-conductor to protect it from the air.

In such bodies as shown in Figs. 2A and 2B, there is at the electrical barrier 35 or 45 no change in phase and no change in crystal structure or orientation; the abrupt change is solely one of chemical composition along the direction of crystal growth and, due to the great immobility of the impurities, this change persists at high temperatures. Impairment of the body by pressure, etc., calls for removal of wax and recleaning.

The test currents above referred to may be measured in such a circuit as shown in Fig. 3. Battery 50, say of 5 volts, is applied in the direction of high resistance to the machined and heated germanium body 40, containing p-n junction 35. Ammeter 51 measures current through the body 40, while voltmeter 52 measures the voltage directly across the junction. The current direction may be chosen by proper closure of switch S, the "reverse" direction being that chosen in Fig. 3.

Voltmeter 52 symbolizes a suitable potentiometer circuit for measuring the voltage between Phosphor bronze contact points 53, each about 0.004 inch removed from the junction, of which the location is found by known procedures. The voltage between points 53 and the current across unit area of the junction thus refer to the electrical properties of the p-n junction itself, not including the contact resistances at contacts 41 or the resistance in the body of the germanium.

Figure 4:
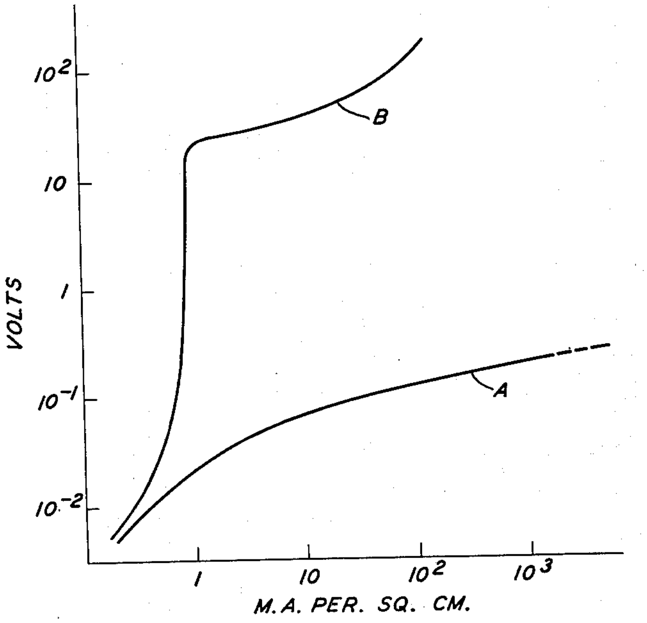
Fig. 4 shows typical current-voltage curves for a p-n junction as in Fig. 2A.

Data from a typical junction measured as above described are shown in the curves of Fig. 4, curve A referring to the "forward," curve B to the "reverse," current, switch S in Fig. 3 being closed upward and downward, respectively.

Figure 5A:
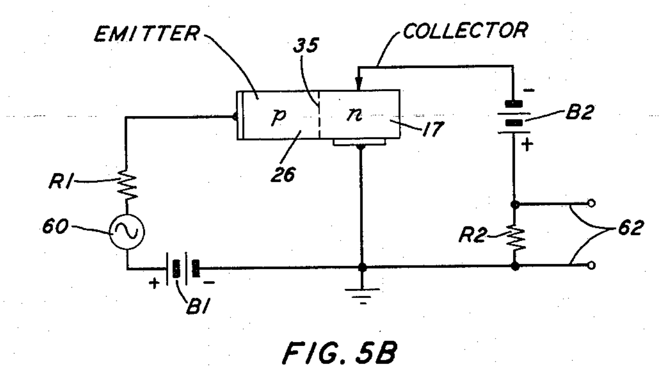
Figs. 5A and 5B are diagrams of electrical circuits in which a p-n junction serves as an amplifier.
Figure 5B:
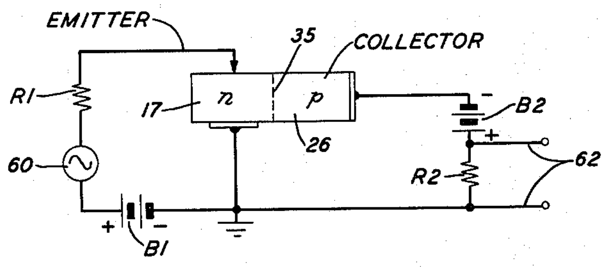

In Fig. 5A, a p-n junction as in Fig. 2A is used as a transistor in an amplifying circuit, the p-type portion and a rectifying point contact on the n-type portion being respectively emitter and collector. In Fig. 5B the junction is reversed, other elements of the circuit being the same. For example battery $B_1$ may be 0.2 volt, battery $B_2$ 100 volts. $R_1$ and $R_2$ are conveniently 10 and 10,000 ohms, respectively. In each case, signals from a source of alternating signal voltage 60 are amplified and appear at output terminals 62. $R_1$ is made equal to the resistance between emitter and ground, $R_2$ to that between collector and ground. With this adjustment, the current in the input circuit is $$\frac{V_1}{2R_1}$$

that in the output circuit $$\frac{V_2}{2R_2}$$

$V_1$ and $V_2$ are the alternating input and output voltages, respectively. The voltage across terminals 62 is available for later connected apparatus, or resistor $R_2$ may be itself the load supplied.

In each case the alternating current from the input circuit is $$\frac{V_1}{2}\cdot\frac{V_1}{2R_1}=\frac{V_1^2}{4R_1}$$

Similarly in the output circuit, the power is $$\frac{V_2^2}{4R_2}$$

The power ratio, therefore, is $$\left(\frac{V_2}{V_1}\right)^2\cdot\frac{R_1}{R_2}$$

In the numerical example given for illustration, this ratio is 250.

Figure 6:
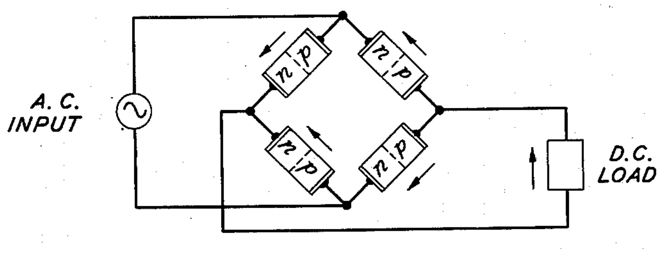
Fig. 6 is a circuit diagram of a full wave rectifier using p-n junctions.

Fig. 6 illustrates the use of p-n junctions in a full wave rectifier bridge, the arrows indicating the forward direction of current for the junction and the direction of the rectified current in the load.

Figure 7:
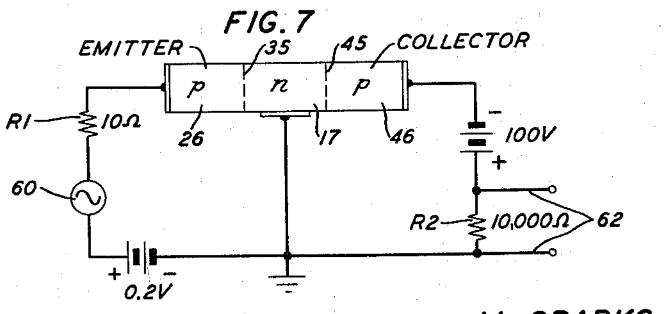
Fig. 7 is a circuit diagram in which a p-n-p junction serves as an amplifier.

Fig. 7 illustrates the circuit connection of a p-n-p structure as an amplifier. The values of direct-current biases and of resistances $R_1$ and $R_2$ are the same as for Figs. 5A and 5B. It will be noted that in Figs. 5A, 5B and 7 the p-type material is in effect a replacement of a rectifying point contact made to the n-type material.

Generically amplifiers using semiconductors as above described are in themselves well known, being disclosed for example in the Sparks application Serial No. 103,474 earlier referred to as well as in application Serial No. 33,466, filed June 17, 1948, now Patent 2,524,035, granted October 3, 1950 by J. Bardeen and W. H. Brattain, "Three Electrode Circuit Element Utilizing Semiconductive Materials." Likewise well known is the rectifying property of p-n junctions, as shown by the patents referred to at the outset of this description. However, none of the p-n junctions hitherto produced have been in the form of single crystals, strain free and stable.

While the invention and its applications have been described with reference to germanium, obviously silicon may be equally well dealt with by the method described herein.

What is claimed is:

1. The method of making p-n junctions in semiconductor material which comprises melting a mass of material of one electrical conductivity type, maintaining the melt at a temperature above the melting point, partly immersing in the melt a seed crystal of the material of the opposite electrical conductivity type and lifting the crystal from the melt at a rate substantially the same as the rate of solidification of the material uplifted from the melt adherent to the crystal.

2. The method as in claim 1 of making p-n junctions in germanium.

3. The method as in claim 1 of making p-n junctions in silicon.

4. The method of making p-n junctions in semiconductor material which comprises melting a mass of the material of one conductivity type, adding to the molten mass an impurity converting it to the opposite conductivity type, maintaining the converted material at a temperature above the melting point, preparing a seed crystal of the material of the one type, partly immersing the seed crystal in the converted molten material, and lifting the seed crystal from the mass at a rate substantially equal to the rate of solidification of the material uplifted from the melt adherent to the crystal.

5. The method as in claim 4 of making p-n junctions in which the material melted is initially of n-type conductivity and is converted to p-type conductivity by adding an acceptor impurity and in which the seed crystal is of n-type conductivity.

6. The method of making single rod crystals of semi-conductor material containing lengthwise consecutive regions alternating in electrical conductivity type which comprises melting a mass of the material of one electrical conductivity type, maintaining the melt at a temperature above the melting point, preparing a seed crystal of the material of the opposite conductivity type, partly immersing the crystal in the melt, lifting from the melt the crystal and the molten material adherent thereto at a rate substantially that of crystallization of the adherent material, machining the solidified lifted material to form with the seed crystal a compound seed crystal comprising adjoining portions of one and of the opposite conductivity type, partly immersing in the melt the portion of the compound crystal of the opposite conductivity type and lifting from the melt the compound crystal at a rate substantially that of solidification of the molten material adherent to the immersed portion.

MORGAN SPARKS.
GORDON K. TEAL.

REFERENCES CITED

The following references are of record in the file of this patent:

UNITED STATES PATENTS

| Number | Name | Date |
|---|---|---|
| 1,531,784 | Hazelett | Mar. 31, 1925 |
| 1,921,934 | Lewis | Aug. 8, 1933 |
| 2,091,903 | Boggett et al. | Aug. 31, 1937 |
| 2,188,771 | Welch | Jan. 30, 1940 |
| 2,402,582 | Scaff | June 25, 1946 |
| 2,402,839 | Ohl | June 25, 1946 |

OTHER REFERENCES

"Journal of Metals," June 1951, pp. 461–464.